(12) United States Patent
Nishide et al.

(10) Patent No.: US 10,378,104 B2
(45) Date of Patent: Aug. 13, 2019

(54) PROCESS FOR PRODUCING CARBON NANOTUBES AND METHOD FOR FORMING WIRING

(71) Applicant: TOKYO ELECTRON LIMITED, Tokyo (JP)

(72) Inventors: Daisuke Nishide, Nirasaki (JP); Takashi Matsumoto, Nirasaki (JP); Munehito Kagaya, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 68 days.

(21) Appl. No.: 15/151,760

(22) Filed: May 11, 2016

(65) Prior Publication Data

US 2016/0251757 A1    Sep. 1, 2016

Related U.S. Application Data

(63) Continuation of application No. PCT/JP2014/077118, filed on Oct. 3, 2014.

(30) Foreign Application Priority Data

Nov. 13, 2013 (JP) .................................. 2013-234743

(51) Int. Cl.
C23C 16/26 (2006.01)
H01L 21/285 (2006.01)
(Continued)

(52) U.S. Cl.
CPC .............. C23C 16/26 (2013.01); C01B 32/16 (2017.08); C01B 32/162 (2017.08);
(Continued)

(58) Field of Classification Search
None
See application file for complete search history.

(56) References Cited

U.S. PATENT DOCUMENTS 6,831,017 B1 * 12/2004 Li .......................... B82Y 10/00
257/E21.131
2003/0004058 A1 * 1/2003 Li .......................... B01J 23/745
502/258
(Continued)

FOREIGN PATENT DOCUMENTS

JP    2001-220674 A    8/2001
JP    2003-277031 A    10/2003
(Continued)

OTHER PUBLICATIONS

Article by Azad Naeemi, et al. "Conductance Modeling for Graphene Nanoribbon (GNR) Interconnects" IEEE EDL. vol. 28, p. 428 (2007).
(Continued)

*Primary Examiner* — Mandy C Louie
(74) *Attorney, Agent, or Firm* — Nath, Goldberg & Meyer; Jerald L. Meyer

(57) ABSTRACT

A carbon nanotube producing method, which is capable of realizing a low resistant depth-wise wiring. An acetylene gas is first supplied as a carbon-containing gas and subsequently, an ethylene gas is supplied as the carbon-containing gas such that carbon nanotubes are produced.

13 Claims, 15 Drawing Sheets

(51) Int. Cl.
*H01L 21/768* (2006.01)
*C01B 32/16* (2017.01)
*C01B 32/162* (2017.01)
*H01L 23/532* (2006.01)

(52) U.S. Cl.
CPC .. *H01L 21/28556* (2013.01); *H01L 21/76879* (2013.01); *C01B 2202/08* (2013.01); *H01L 23/53276* (2013.01); *H01L 2221/1094* (2013.01); *H01L 2924/0002* (2013.01)

(56) References Cited

U.S. PATENT DOCUMENTS

| | | | |
|---|---|---|---|
| 2006/0078489 A1* | 4/2006 | Harutyunyan | B82Y 30/00 423/447.3 |
| 2007/0237706 A1* | 10/2007 | Black | B82Y 30/00 423/447.3 |
| 2008/0187648 A1* | 8/2008 | Hart | B01J 23/745 427/8 |
| 2008/0311818 A1* | 12/2008 | Kim | B82Y 30/00 445/50 |
| 2010/0221424 A1* | 9/2010 | Malecki | B82Y 30/00 427/249.1 |
| 2012/0076718 A1* | 3/2012 | Liu | B82Y 30/00 423/447.3 |
| 2012/0077715 A1* | 3/2012 | Liu | B82Y 30/00 506/22 |

FOREIGN PATENT DOCUMENTS

| | | | |
|---|---|---|---|
| JP | 2003-277033 A | 10/2003 | |
| JP | 2004-284921 A | 10/2004 | |
| JP | 2005-029414 A | 2/2005 | |
| JP | 2007-070158 A | 3/2007 | |
| JP | 2007-145634 A | 6/2007 | |
| JP | 2007-254167 A | 10/2007 | |
| JP | 2008-024570 A | 2/2008 | |
| JP | 2008-074647 A | 4/2008 | |
| JP | 2008-169092 A | 7/2008 | |
| JP | 2008-251961 A | 10/2008 | |
| JP | 2009-137805 A | 6/2009 | |
| JP | 2009137805 * | 6/2009 | ............ C01B 31/02 |
| JP | 2009-536912 A | 10/2009 | |
| JP | 2009-298698 A | 12/2009 | |
| JP | 2010-503595 A | 2/2010 | |
| JP | 2010-100463 A | 5/2010 | |
| JP | 2010-163331 A | 7/2010 | |
| JP | 2010-177405 A | 8/2010 | |
| JP | 2010-269982 A | 12/2010 | |
| JP | 2011-068513 A | 4/2011 | |
| JP | 2011-207635 A | 10/2011 | |
| JP | 2011-230980 A | 11/2011 | |
| JP | 2012-041249 A | 3/2012 | |
| JP | 2012-518891 A | 8/2012 | |
| JP | 2012-176855 A | 9/2012 | |
| JP | 2012-176856 A | 9/2012 | |
| JP | 2012-218949 A | 11/2012 | |
| JP | 2013-018673 A | 1/2013 | |
| JP | 2013-503465 A | 1/2013 | |
| JP | 2013-027843 A | 2/2013 | |
| JP | 2013-035750 A | 2/2013 | |
| WO | 2004/071654 A1 | 8/2004 | |
| WO | 2006/011655 A1 | 2/2006 | |
| WO | 2007/074506 A1 | 7/2007 | |
| WO | 2007/105707 A1 | 9/2007 | |
| WO | WO2007100306 * | 9/2007 | ............ B82B 3/00 |
| WO | 2007/139086 A1 | 12/2007 | |
| WO | 2009/008291 A1 | 1/2009 | |

OTHER PUBLICATIONS

Article by Sergey N. Zaretskiy, et al. "Growth of carbon nanotubes from Co nanoparticles and C2H2 by thermal chemical vapor deposition" Chemical Physics Letters 372 (2003) 300-305.

Article by D.Phokharatkul, et al. "Study of Graphene Growth on Ni Thin film by Two-step Chemical Vapor Deposition" National Electronics and Computer Technology Center.

ISR issued in international application No. PCT/JP2014/077118 dated Dec. 16, 2014.

* cited by examiner

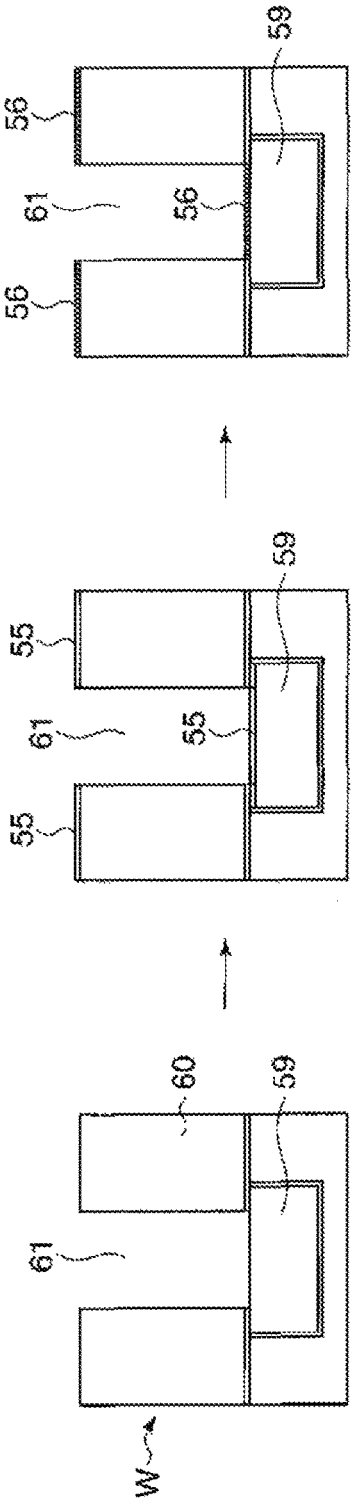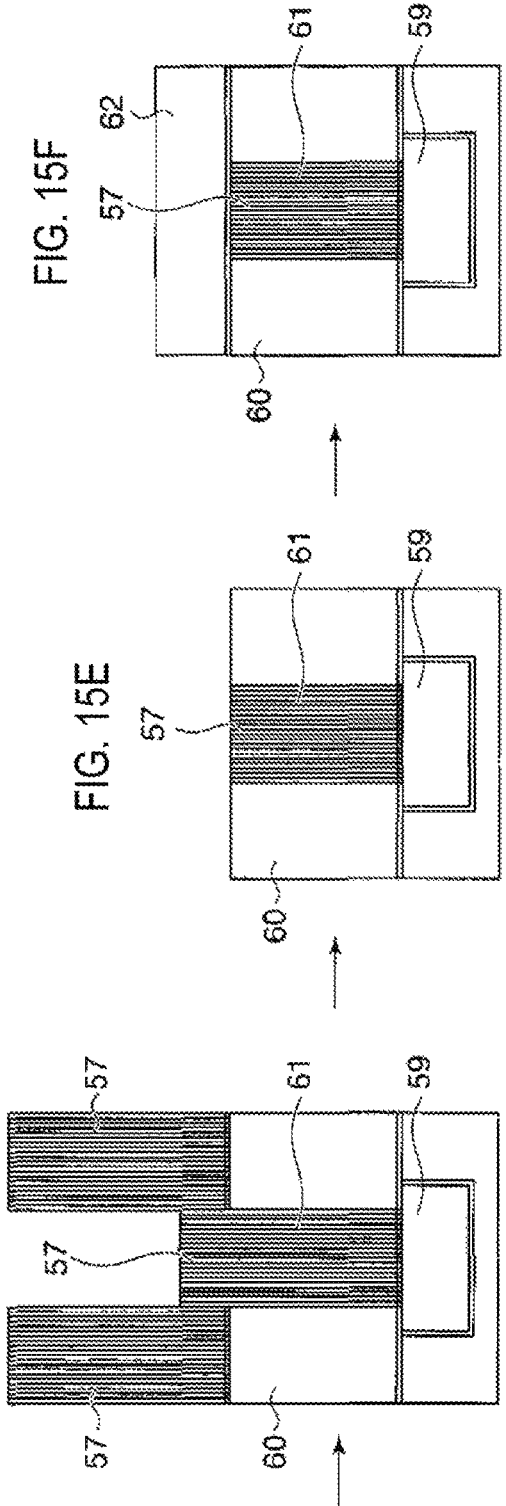

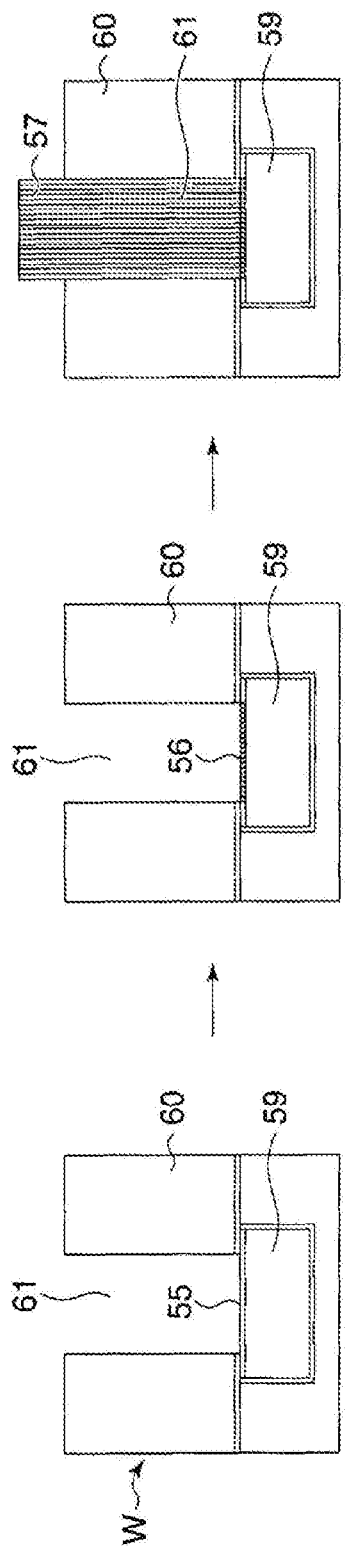

US 10,378,104 B2

PROCESS FOR PRODUCING CARBON NANOTUBES AND METHOD FOR FORMING WIRING

CROSS-REFERENCE TO RELATED APPLICATION

This application is a Continuation application of PCT International Application No. PCT/JP2014/077118, filed Oct. 3, 2014, which claimed the benefit of Japanese Patent Application No. 2013-234743, filed Nov. 13, 2013, the entire content of each of which is hereby incorporated by reference

TECHNICAL FIELD

The present disclosure relates to a carbon nanotube producing method and a wiring forming method, more particularly, to a carbon nanotube producing method, which is suitable to be used for a depth-wise wiring in a three-dimensional packaging device.

BACKGROUND

Metal (for example, Cu) has been used for three-dimensional packaging devices. However, a micro wiring structure made of a metal wiring material such as Cu has a problem that wiring has high resistance since conduction electrons are greatly affected by inelastic scattering at an interface due to a thin line effect.

On the other hand, a nano-carbon material (for example, graphene or carbon nanotube) differing from metal has an extremely long mean free path and a high mobility. Such a material shows a possibility of achievement of low-resistance wiring in excess of Cu when it is applied to the micro wiring structure. Therefore, in the next generation three-dimensional packing devices required to achieve a finer layered structure or wiring structure, it has been considered to use the nano-carbon material, instead of Cu, for wirings, for example, to use graphene for a horizontal wiring formed by a trench and to use carbon nanotubes for a vertical wiring formed by a via hole. In particular, a depth-wise wiring is achieved by bundling a plurality of formed carbon nanotubes.

The carbon nanotubes are a cylindrical cluster of carbon atoms, which is obtained by decomposing a carbon-containing gas with catalyst metal particles used as a catalyst and bonding carbon atoms together. The carbon nanotubes can be suitably used for the depth-wise wiring in three-dimensional packing devices since they are uni-directionally grown from the catalyst metal particles. Typically, an acetylene ($C_2H_2$) gas or an ethylene ($C_2H_4$) gas is used as the carbon-containing gas to produce the carbon nanotubes, However, when the acetylene gas is used, while lengths of the produced carbon nanotubes are aligned, the carbon nanotubes tend to be thinner and the resistance may not be decreased as expected even when the produced carbon nanotubes are used for wiring.

On the other hand, when ethylene gas is used, while the carbon nanotubes become thicker, since the lengths of the carbon nanotubes tend not to be aligned, the carbon nanotubes may not function as the depth-wise wiring even when they are bundled.

SUMMARY

The present disclosure provides some embodiments of a carbon nanotube producing method and a wiring forming method, which are capable of achieving a low-resistance depth-wise wiring.

According to one embodiment of the present disclosure, there is provided a method of producing a carbon nanotube by supplying a carbon-containing gas onto a substrate, which includes: supplying at least an acetylene gas as the carbon-containing gas at an initial stage of carbon nanotube production; and supplying at least an ethylene gas as the carbon-containing gas at a termination stage of carbon nanotube production, wherein the initial stage of carbon nanotube production includes: a first carbon-containing gas supplying step in which only the acetylene gas as the carbon-containing gas is supplied; and a second carbon-containing gas supplying step in which at least the ethylene gas as the carbon-containing gas is supplied after the first carbon-containing gas supplying step.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

11A showing a case where the wafer temperature is 500 degrees C. and FIG. 11B showing a case where the wafer temperature is 525 degrees C.

FIGS. 15A to 15F are process charts of a wiring forming method to which the carbon nanotube producing method of the present disclosure is applied.

FIGS. 16A to 16E are process charts of another wiring forming method to which the carbon nanotube producing method of the present disclosure is applied.

DETAILED DESCRIPTION

Embodiments of the present disclosure will now be in detail described with reference to the drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First, a carbon nanotube producing method according to a first embodiment of the present disclosure will be described.

Figure 1:
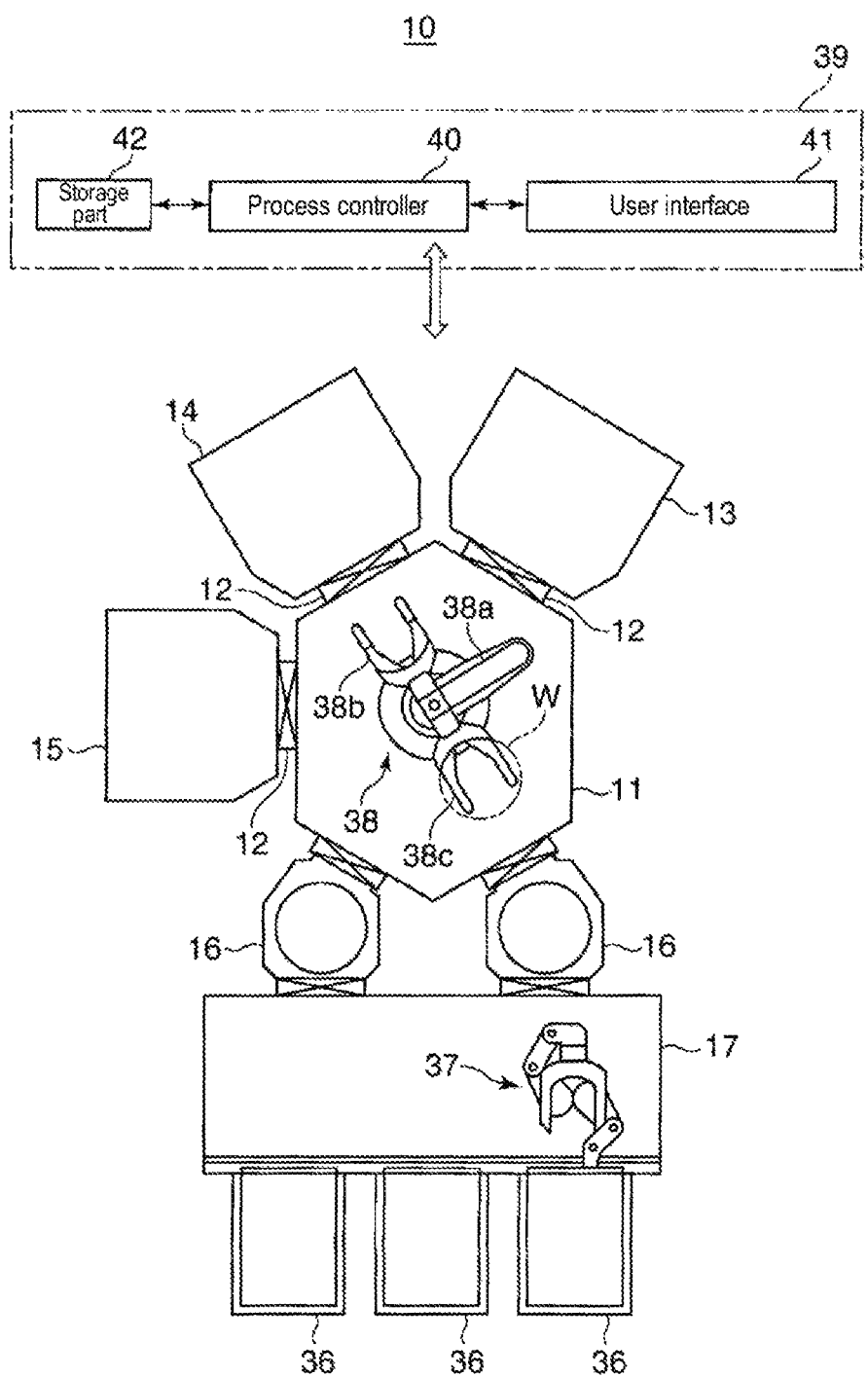
FIG. 1 is a plan view schematically illustrating a configuration of a substrate processing system which is used for a carbon nanotube producing method according to one embodiment of the present disclosure.

FIG. 1 is a plan view schematically illustrating the configuration of a substrate processing system used for a carbon nanotube producing method according to this embodiment. In FIG. 1, internal components are shown as transparent for the sake of convenience.

Referring to FIG. 1, a substrate processing includes: a depressurized transfer chamber 11 which has substantially a hexagonal shape when viewed from the top; a catalyst metal layer forming chamber 13 which is coupled to the depressurized transfer chamber 11 via a gate valve 12 radially disposed around the depressurized transfer chamber 11; a pretreatment chamber 14; a thermal CVD chamber 15; two load lock chambers 16 connected to a side of the depressurized transfer chamber 11, which is not connected to the catalyst metal layer forming chamber 13, the pretreatment chamber 14 and the thermal CVD chamber 15; and a loader chamber 17 which is disposed to face the depressurized transfer chamber 11 via the two load lock chambers 16 and is connected to the two load lock chambers 16. The substrate processing system 10 is provided to grow carbon nanotubes in a semiconductor wafer (hereinafter referred simply to as a "wafer") W such as a silicon substrate.

The depressurized transfer chamber 11 includes a transfer mechanism 38 configured to transfer the wafer W between the catalyst metal layer forming chamber 13, the pretreatment chamber 14, the thermal CVD chamber 15 and the load lock chambers 16. The interior of the depressurized transfer chamber 11 is depressurized to a predetermined degree of vacuum. The transfer mechanism 38 is disposed substantially at the center of the depressurized transfer chamber 11, and includes a rotatable/expansible part 38a and two support arms 38b and 38c installed in a leading end of the rotation/expansion part 38a and configured to support the wafer W. The two support arms 38b and 38c are installed to the rotation/expansion part 38a such that they are in opposite one another.

The interiors of the catalyst metal layer forming chamber 13, the pretreatment chamber 14 and the thermal CVD chamber 15 are depressurized to a predetermined degree of vacuum, like the depressurized transfer chamber 11. As shown in FIGS. 4A to 14C, the catalyst metal layer forming chamber 13 is used to form a catalyst metal layer 55 on the wafer W by sputtering, deposition, CVD or plating, the pretreatment chamber 14 is used to form catalyst metal particles 56 from the catalyst metal layer 55 and activate the formed catalyst metal particles 56, and the thermal CVD chamber 15 is used to grow carbon nanotubes 57 on the wafer W by a thermal Chemical Mechanical Deposition (CVD), which will be described later.

The pretreatment chamber 14 produces plasma by microwave power or high frequency power introduced into the interior thereof, forms a plurality of catalyst metal particles 56 having uniform size and shape from the catalyst metal layer 55 formed on the wafer W using the produced plasma, and performs an activation process on the formed catalyst metal particles 56, which will be described later with reference to FIGS. 4A to 14C.

Figure 2:
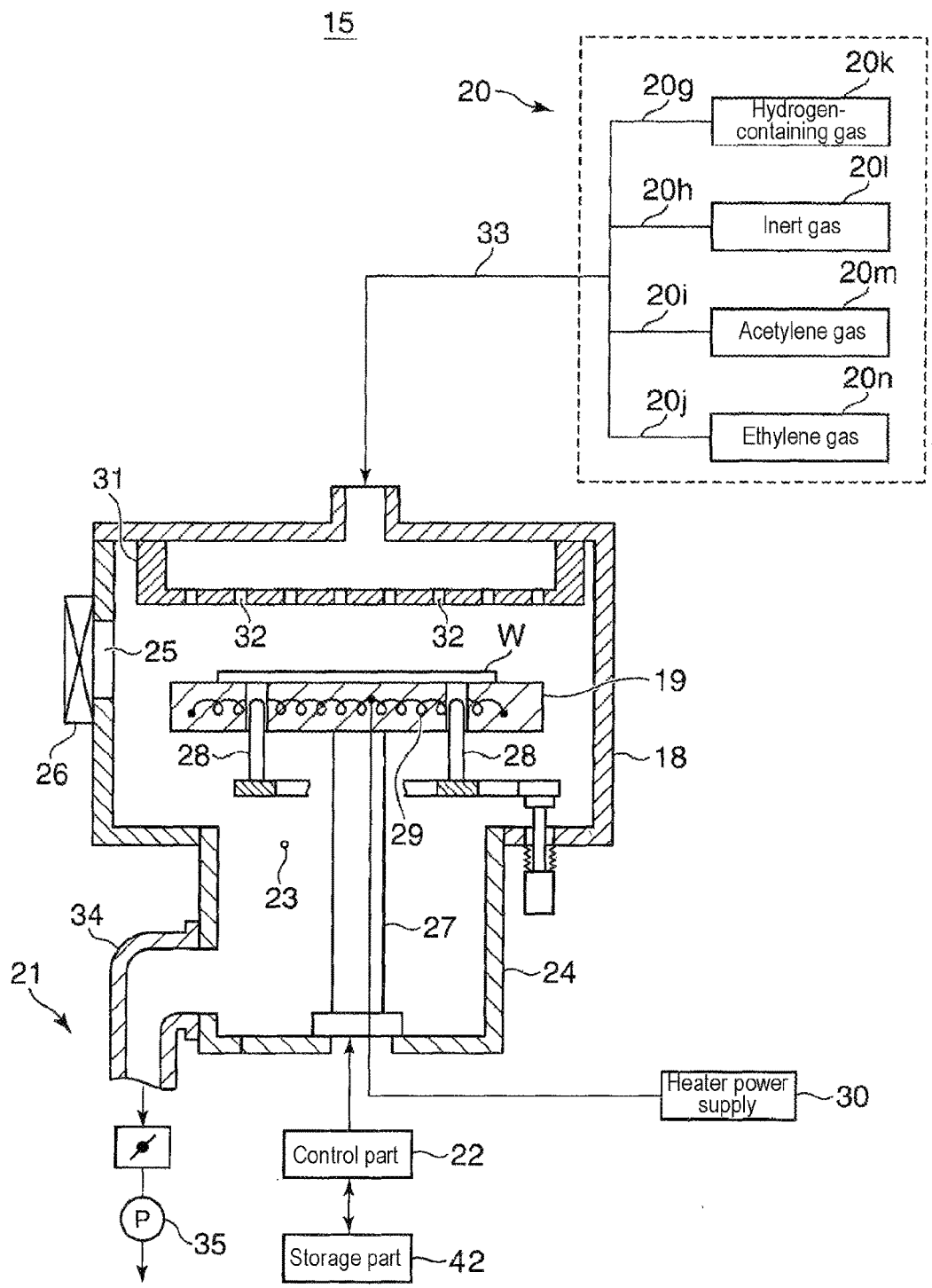
FIG. 2 is a sectional view schematically illustrating a configuration of a thermal CVD chamber shown in FIG. 1.

FIG. 2 is a sectional view schematically illustrating a configuration of the thermal CVD chamber 15 shown in FIG. 1.

Referring to FIG. 2, the thermal CVD chamber 15 includes a substantially cylindrical airtight processing chamber 18, a mounting table 19 disposed inside the processing chamber 18 and configured to mount the wafer W thereon, a gas supply part 20 configured to supply gas into the processing chamber 18, an exhaust part 21 configured to exhaust gas from the interior of the processing chamber 21, and a control part 22 configured to control operations of respective components of the thermal CVD chamber 15.

A circular opening 23 is formed substantially in the center of a bottom wall of the processing chamber 18. An exhaust chamber 24 which is in communication with the interior of the processing chamber 18 via the opening 23 and is formed to project downward in FIG. 2, is disposed in the bottom wall. A loading/unloading port 25 through which the wafer W is loaded into and unloaded from the processing chamber 18, and a gate valve 26 configured to open/close the loading/unloading port 25, are disposed in a side wall of the processing chamber 18.

The mounting table 19 is made of, for example, ceramics of AlN, and is supported by a cylindrical ceramic post 27 extending upward from the bottom center of the exhaust chamber 24. Lift pins 28 for lifting the wafer W are disposed inside the mounting table 19. The Lift pins 28 project from a surface of the mounting table 19 to separate the wafer W from the mounting table 19.

The mounting table 19 includes a heater 29 of a resistance heating type incorporated therein. The heater 29 is connected to a heater power supply 30. The heater power supply 30 supplies power to the heater 29 such that the wafer W mounted on the mounting table 19 is heated. In addition, a thermocouple (not shown) is inserted in the mounting table 19 so as to measure a temperature of the wafer W. The heater 29 is configured to control the temperature of the wafer W within a range of 50 to 1000 degrees C. In the following description, unless otherwise specified, the temperature of the wafer W means a temperature measured by the thermocouple, rather than a set temperature of the heater 29.

The gas supply part 20 is coupled, via a gas supply path 33, to a shower plate 31 formed to uniformly blow a supplied gas into the processing chamber 18. The shower plate 31 has a plurality of gas discharge holes 32 opened to face the mounting table 19. The gas supply part 20 includes four branch lines 20g, 20h, 20i and 20j which are branched from the gas supply path 33 connected to the shower plate 31. The branch line 20g is connected to a hydrogen-containing gas supply source 20k configured to supply a hydrogen-containing gas. The branch line 20h is connected to an inert gas supply source 20l configured to supply an inert gas. The branch line 20i is connected to an acetylene gas supply source 20m configured to supply an acetylene gas used as a carbon-containing gas. The branch line 20j is connected to an ethylene gas supply source 20n configured to supply an ethylene gas used as the carbon-containing gas. In addition, a mass flow controller and a valve (not shown) are installed in each of the branches 20g, 20h, 20i and 20j.

In the thermal CVD chamber 15, an example of a hydrogen-containing gas may include a hydrogen ($H_2$) gas, an ammonia ($NH_3$) gas or the like, and an example of the inert gas may include a nitrogen gas or an argon (Ar) gas or the like. The inert gas supplied from the inert gas supply source 20l is used as, for example, a purge gas or a carrier gas.

The exhaust part 21 includes an exhaust pipe 34 opened to a side surface of the exhaust chamber 24, and a vacuum pump 35 connected to the exhaust pipe 34. By actuating the vacuum pump 35, the exhaust part 21 uniformly introduces an internal gas of the processing chamber 18 into an inner space of the exhaust chamber 24 and exhausts the gas from the inner space via the exhaust pipe 34 outside. Thus, the interior of the processing chamber 18 can be rapidly depressurized to 0.133 Pa.

Returning to FIG. 1, the loader chamber 17 includes a transfer robot 27 having a multi-joint arm structure, which is configured to transfer the wafer W between carriers 36 that accommodate the plurality of wafers W, and the load lock chambers 16. The interior of the loader chamber 17 is maintained at atmospheric pressure.

The interior of load lock chambers 16 can be switched between an atmospheric pressure environment and a depressurized environment. For example, when the wafer W is transferred between the load lock chambers 16 and the transfer robot 27 of the loader chamber 17, the interior of load lock chambers 16 is switched to the atmospheric pressure environment to communicate with the interior of the loader chamber 17. On the other hand, when the wafer W is transferred between the load lock chambers 16 and the transfer mechanism 38 of the depressurized transfer chamber 11, the interior of load lock chambers 16 is switched to the depressurized environment to communicate with the interior of the depressurized transfer chamber 11. That is to say, the interior of load lock chambers 16 is switched between the atmospheric pressure environment and the depressurized environment such that the wafer W is transferred between the depressurized transfer chamber 11 and the loader chamber 17.

In addition, while in this embodiment, the catalyst metal layer forming chamber 13 has been described to be installed in the substrate processing system 10, the catalyst metal layer forming chamber 13 may not be necessarily installed in the substrate processing system 10 as long as the catalyst metal particles 56 formed from the catalyst metal layer 55 can be activated in the substrate processing system 10.

In addition, the substrate processing system 10 further includes a control part 39 configured to control operations of respective components. The control part 39 controls the operations of the respective components of the substrate processing system 10, for example, the thermal CVD chamber 15 and the transfer mechanism 38. The control part 39 includes a process controller 40 equipped with a microprocessor (computer)), a user interface 41 and a storage part 42.

The user interface 41 includes a keyboard or a touch panel through which an operator performs a command input operation or other operation to operate the catalyst metal layer forming chamber 13, the pretreatment chamber 14 and the thermal CVD chamber 15, a display which visually displays the operating situations of the catalyst metal layer forming chamber 13, the pretreatment chamber 14 and the thermal CVD chamber 15. The storage part 42 stores a control program (software) for implementing various processes performed in the catalyst metal layer forming chamber 13 and the like under the control of the process controller 40, and recipes in which process condition data and the like is recorded.

In response to an instruction from the user interface 41, the control part 39 calls an arbitrary recipe out from the storage part 42 and controls the process controller 40 to execute the recipe. At this time, for example, desired processes (for example, processes corresponding to a carbon nanotube producing method of FIG. 3 to be described later) are performed in the thermal CVD chamber 15.

The control program and the recipe in which the process condition data is recorded, may be stored in an external computer-readable recording medium (not shown). Examples of the recording medium may include a CD-ROM, a hard disk, a flexible disk and a flash memory. In some embodiments, the recipes may be recipes transmitted from other apparatuses via a dedicated line or the like.

Figure 3:
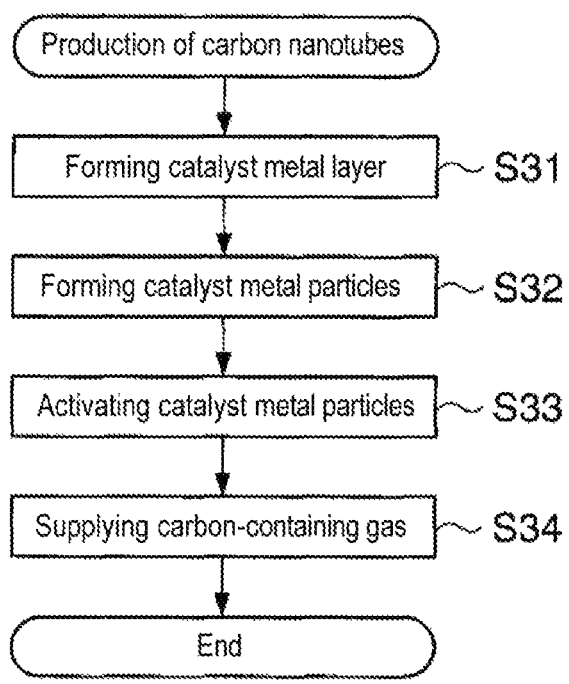
FIG. 3 is a flow chart illustrating a carbon nanotube producing method performed by a CVD film forming apparatus shown in FIG. 1.

FIG. 3 is a flow chart illustrating the carbon nanotube producing method performed in the substrate processing system 10 of FIG. 1 and FIGS. 4A to 14C are process charts corresponding to the flow chart of FIG. 3.

Figure 4A:
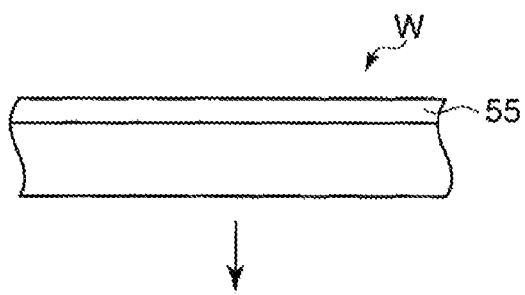
FIGS. 4A to 4C are process charts corresponding to the flow chart of FIG. 3.
Figure 4B:
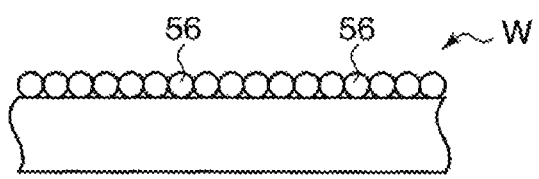

First, in the catalyst metal layer forming chamber 13, the catalyst metal layer 55 is formed on the wafer W (Step S31) (FIG. 4A). In addition, even when the catalyst metal layer 55 is formed outside of the substrate processing system 10, a sputtering, deposition, plating or the like may be used. Metal constituting the catalyst metal layer 55 may include a transition metal such as Cu, Fe, Co, Ni, Ru, Au, Pt or the like, or an alloy containing the transition metal. In addition, the wafer W may be a glass substrate or a plastic (polymer) substrate, instead of the silicon substrate.

Subsequently, in the pretreatment chamber 14, a plurality of uniform catalyst metal particles 56 are formed from the catalyst metal layer 55 (Step S32) (FIG. 4B) and are activated by removing oxides of surfaces of the catalyst metal particles 56 (Step S33).

The formation of the uniform catalyst metal particles 56 (Step S32) is required to grow uniform carbon nanotubes 57. When the uniform catalyst metal particles 56 are formed, metal atoms can be easily moved by removing impurities such as organic substances adhered to the surface of the catalyst metal layer 55 by plasma. As a result, migration by plasma heating occurs on the surface of the catalyst metal layer 55 so that the metal constituting the catalyst metal layer 55 is agglomerated and micro-particulated. In addition, in the formation of the uniform catalyst metal particles 56, an inert gas such as an argon gas or a mixture of an inert gas and a hydrogen-containing gas (e.g., a hydrogen gas) is used to generate the plasma.

In the oxide removal and activation of the surfaces of the catalyst metal particles 56 (Step S33), the catalyst metal layer 55 and the catalyst metal particles 56 are subjected to a plasma treatment. Further, in the oxide removal and activation of the surfaces of the catalyst metal particles 56, the hydrogen-containing gas (used as a reducing gas) such as the hydrogen gas or the ammonia gas used in removing the oxides and the inert gas such as the argon gas used in generating and stabilizing the plasma are simultaneously mixed and used.

Further, the plasma generated from the mixture of the hydrogen-containing gas such as the hydrogen gas and the inert gas such as the argon gas can be used to perform Step S32 (the formation of the catalyst metal particles) and Step S33 (the oxide removal and activation of the surfaces of the catalyst metal particles) at once. On the other hand, in order to control the size of the formed catalyst metal particles 56 more closely, the plasma generated from the inert gas alone such as the argon gas may be used to perform Step S32, and subsequently the mixture of the hydrogen-containing gas such as the hydrogen gas and the inert gas such as the argon gas may be used to perform Step S33.

In this embodiment, the formation of the catalyst metal particles 56 and the activation of the surfaces thereof are referred to as a "pretreatment process." By the pretreatment process, the number of catalyst metal particles 56 having activated surfaces and the uniform size and shape are obtained. As appropriate pretreatment conditions, for example, the temperature of the wafer W is 300 to 600 degrees C., a flow rate of the argon gas is 500 to 2000 sccm, a flow rate of the hydrogen gas is 500 to 2,000 sccm, an internal pressure of the pretreatment chamber 14 is 10 to 100 Pa, the microwave power introduced into the pretreatment chamber 14 is 100 to 2,000 W, and a processing time is 1 to 10 minutes.

The pretreatment process may be performed in the thermal CVD chamber 15. However, this requires installing a microwave application mechanism or a high frequency application mechanism in the thermal CVD chamber 15, thus complicating the configuration of the thermal CVD chamber 15. In addition, it takes a long period of time for one sheet of the wafer W to occupy the thermal CVD chamber 15, thus resulting in a poor throughput. Therefore, as described in this embodiment, it is preferable that the pretreatment process is performed in the pretreatment chamber 14 instead of the thermal CVD chamber 15. Detailed conditions and effects of the pretreatment process are disclosed in Japanese laid-open publication No. 2013-27843 in which the present inventors are described as inventors.

Figure 4C:
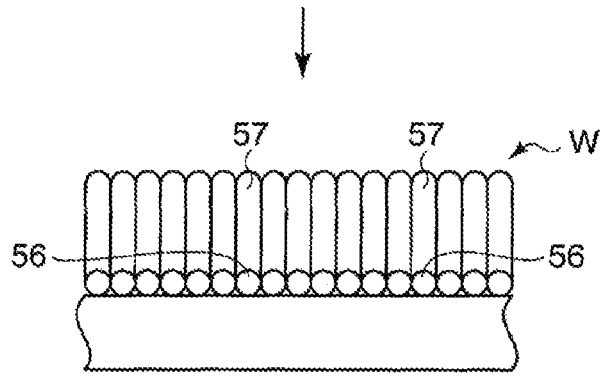

Subsequently, the wafer W subjected to the pretreatment process in the thermal CVD chamber 15 is mounted on the mounting table 19 in the processing chamber 18. Thereafter, the argon gas is introduced into the processing chamber 18, and the carbon-containing gas such as the acetylene gas or the ethylene gas, along with the hydrogen gas, are supplied into the processing chamber 18 via the shower plate 31 (Step S34). At this time, the hydrogen gas acts as a carrier gas. Once the carbon-containing gas reaches the substrate, carbon atoms generated from the carbon-containing gas by thermal decomposition are bonded to each other using the catalyst metal particles 56 as nuclei so that the carbon nanotubes 57 are generated (FIG. 4C).

From the viewpoint of maintaining a sufficient growth rate of the carbon nanotubes 57, the internal pressure of the processing chamber 18 in the generation of the carbon nanotubes 57 is preferably 66.7 to 667 Pa (0.5 to 5 Torr), more preferably 400 to 667 Pa.

In addition, from the viewpoint of efficiently growing the carbon nanotubes 57, a flow rate of the carbon-containing gas is preferably 5 to 200 mL/min (sccm), more preferably 6 to 30 mL/min (sccm).

Furthermore, by introducing the argon gas, along with the carbon-containing gas and the hydrogen gas, into the processing chamber 18, it is possible to accelerate the growth of the carbon nanotubes 57 and improve the quality thereof. However, the argon gas and the hydrogen gas may not be necessarily used. When the argon gas is introduced, from the viewpoint of efficiently growing the carbon nanotubes 57, a flow rate of the argon gas is preferably 100 to 2,000 mL/min (sccm), more preferably 300 to 1,000 mL/min (sccm).

From the viewpoint of preventing the surface activation of the catalyst metal particles 56 from being reduced and growing the carbon nanotubes 57 up to a sufficient length, the processing time is preferably 1 to 120 minutes, more preferably 1 to 15 minutes.

In the generation of the carbon nanotubes 57 using the thermal CVD method, the argon gas may be replaced with other noble gas such as He, Ne, Kr or Xe. In addition, by simultaneously introducing a reducing gas such as $H_2$ or $NH_3$, along with the carbon-containing gas, into the processing chamber 18, it is possible to increase the growth rate of the carbon nanotubes 57 and improve the quality thereof.

In the thermal CVD method, the carbon nanotubes 57 grow from the catalyst metal particles 56 in one direction (the upward direction in FIG. 4C) so as not to collide with each other while maintaining the properties of the catalyst metal particles 56. Thus, with the plurality of dense and activated catalyst metal particles 56 as nuclei, a high-density of the carbon nanotubes 57 are oriented substantially perpendicular to the surface of the wafer W. In addition, in the thermal CVD method, since no plasma is generated, the carbon nanotubes 57 are not damaged by electrons and ions in plasma. This suppresses crystal defects and introduction of impurities, thus forming the carbon nanotubes 57 with fewer impurities and better crystallinity.

In addition, while in this embodiment, the carbon nanotubes 57 has been described to be produced by thermally decomposing the carbon-containing gas by the thermal CVD method in the thermal CVD chamber 15, the carbon nanotubes 57 may be produced by a plasma CVD method. Specifically, the carbon nanotubes 57 may be produced by a carbon plasma which is generated from the carbon-containing gas by a microwave or an RF wave.

The production of the carbon nanotubes 57 may be carried out subsequent to the activation of the catalyst metal particles 56 so as to prevent the surfaces of the activated catalyst metal particles 56 from being inactivated. The carbon nanotubes 57 may be produced in the pretreatment chamber 14 which performed the activation of the catalyst metal particles 56 as long as the carbon-containing gas can be supplied into the pretreatment chamber 14.

Subsequently, after forming the carbon nanotubes 57, the supply of the carbon-containing gas and the like is stopped. Further, the internal pressure of the processing chamber 18 is adjusted, and subsequently, the gate valve 26 is opened to unload the wafer W from the processing chamber 18. In this way, the carbon nanotube producing method is terminated.

In addition, prior to the present disclosure, the present inventors have checked properties of carbon nanotubes formed using only the acetylene gas or the ethylene gas as the carbon-containing gas.

Figure 5A:
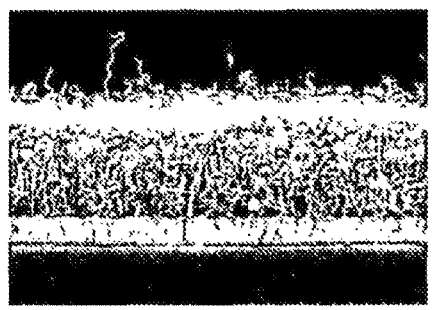
FIGS. 5A to 5D are TEM photographs showing properties of carbon nanotubes produced using only an acetylene gas or an ethylene gas as a carbon-containing gas, FIG. 5A showing a case where only the ethylene gas is used at a wafer temperature of 425 degrees C., FIG. 5B showing a case where only the ethylene gas is used at the wafer temperature of 525 degrees C., FIG. 5C showing a case where only the acetylene gas is used at the wafer temperature of 425 degrees C., and FIG. 5D showing a case where only the acetylene gas is used at the wafer temperature of 525 degrees C.
Figure 5B:
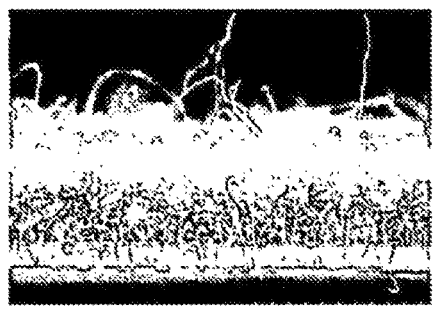
Figure 5C:
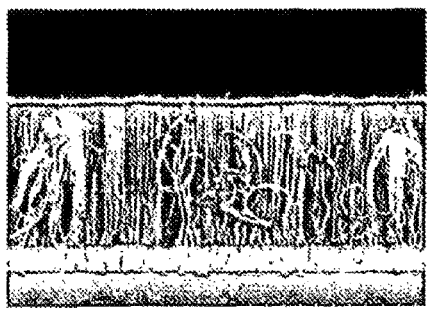
Figure 5D:
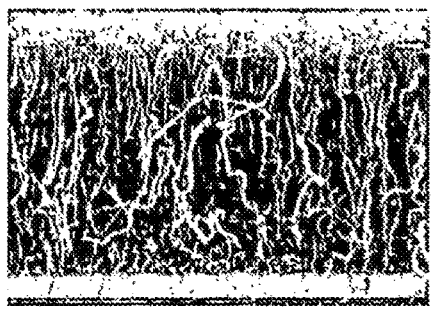

FIGS. 5A to 5D are TEM photographs showing properties of carbon nanotubes produced using only the acetylene gas or the ethylene gas as the carbon-containing gas, FIG. 5A showing a case where only the ethylene gas is used at the wafer temperature of 425 degrees C., FIG. 5B showing a case where only the ethylene gas is used at the wafer temperature of 525 degrees C., FIG. 5C showing a case where only the acetylene gas is used at the wafer temperature of 425 degrees C., and FIG. 5D showing a case where only the acetylene gas is used at the wafer temperature of 525 degrees C.

For the wafer temperature of 425 degrees C., as shown in FIGS. 5A and 5C, it is confirmed that lengths of the formed carbon nanotubes are aligned for either the acetylene gas or the ethylene gas used as the carbon-containing gas. In addition, for the wafer temperature of 525 degrees C., it is confirmed that the lengths of the formed carbon nanotubes are aligned for the acetylene gas used as the carbon-containing gas, as shown in FIG. 5D, whereas the lengths of the formed carbon nanotubes are not aligned for the ethylene gas used as the carbon-containing gas, as shown in FIG. 5B.

From the above confirmation, the present inventors have found that the lengths of the formed carbon nanotubes are aligned for the acetylene gas even when the wafer temperature is changed, whereas the lengths of the formed carbon nanotubes are not aligned for the ethylene gas when the wafer temperature is increased.

Based on the above findings, the present inventors have estimated the reason for change in the lengths of the formed carbon nanotubes depending on the type of carbon-containing gas, as follows.

Figure 6A:
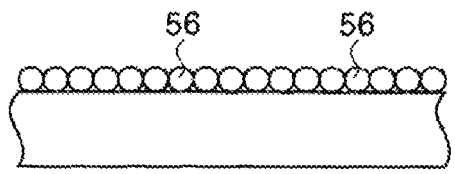
FIGS. 6A to 6D are views used to explain the reason why a length of carbon nanotubes produced depending on the kind of carbon-containing gas is changed.
Figure 6B:
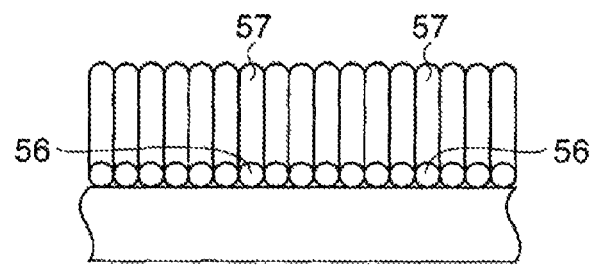

The catalyst metal particles 56 formed on the wafer W are not further agglomerated and not changed in size and density at 425 degrees C. which is relatively low (FIG. 6A). In general, the lengths of the carbon nanotubes 57 depend on the size of the catalyst metal particles 56 acting as nuclei. For example, larger catalyst metal particles 56 provide shorter carbon nanotubes 57 grown from the catalyst metal particles 56, whereas smaller catalyst metal particles 56 provide longer carbon nanotubes 57 grown from the catalyst metal particles 56. In contrast, when the wafer temperature is 425 degrees C., since the catalyst metal particles 56 are not changed in size and density, the lengths of the carbon nanotubes 57 formed from the catalyst metal particles 56 are aligned (FIG. 6B).

Figure 6C:
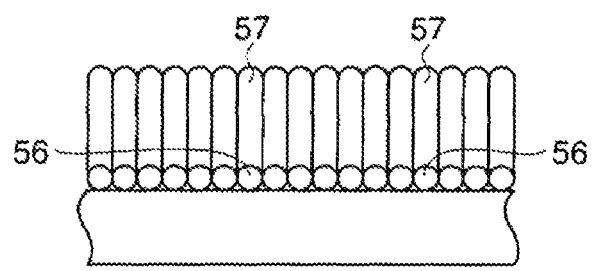
Figure 6D:
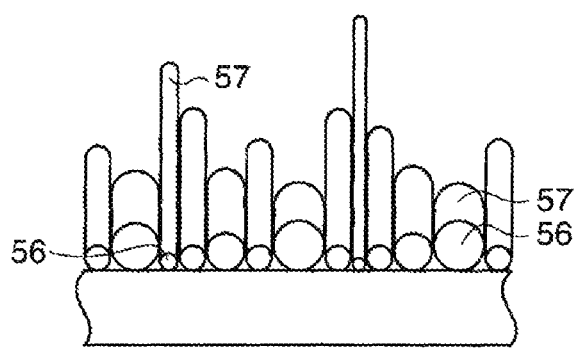

On the other hand, the catalyst metal particles 56 formed on the wafer W are likely to be further agglomerated and changed in size and density at 525 degrees C. which is relatively high. Here, when the acetylene gas is used, since the acetylene gas has high reactivity to be easily thermally decomposed into carbon atoms, the carbon nanotubes 57 are quickly grown from the catalyst metal particles 56 before the catalyst metal particles 56 proceed to be newly agglomerated. That is to say, since the carbon nanotubes 57 are grown while the catalyst metal particles 56 used as nuclei are not changed in size and density, the lengths of the carbon nanotubes 57 are aligned (FIG. 6C). In contrast, when the ethylene gas is used, since the ethylene gas has low reactivity, the catalyst metal particles 56 proceed to be newly agglomerated before the carbon nanotubes 57 are quickly grown from the catalyst metal particles 56. Therefore, the catalyst metal particles 56 are changed in size and density and subsequently, the carbon nanotubes 57 are grown from the catalyst metal particles 56. That is to say, since the catalyst metal particles 56 used as nuclei are changed in size and density, the lengths of the carbon nanotubes 57 are not aligned (FIG. 6D).

Thus, in order to align the lengths of the carbon nanotubes 57, it is estimated that the acetylene gas is preferably used as the carbon-containing gas.

In addition, the present inventors have checked structures of the formed carbon nanotubes.

Figure 7A:
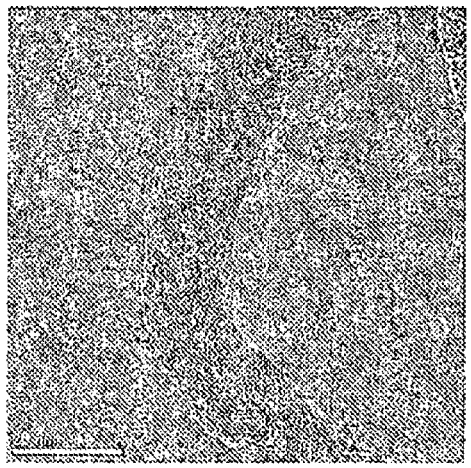
FIGS. 7A to 7D are TEM photographs showing structures of carbon nanotubes produced using only an acetylene gas or an ethylene gas as a carbon-containing gas, FIG. 7A showing a case where only the ethylene gas is used at a wafer temperature of 425 degrees C., FIG. 7B showing a case where only the ethylene gas is used at the wafer temperature of 525 degrees C., FIG. 7C showing a case where only the acetylene gas is used at the wafer temperature of 425 degrees C., and FIG. 7D showing a case where only the acetylene gas is used at the wafer temperature of 525 degrees C.
Figure 7B:
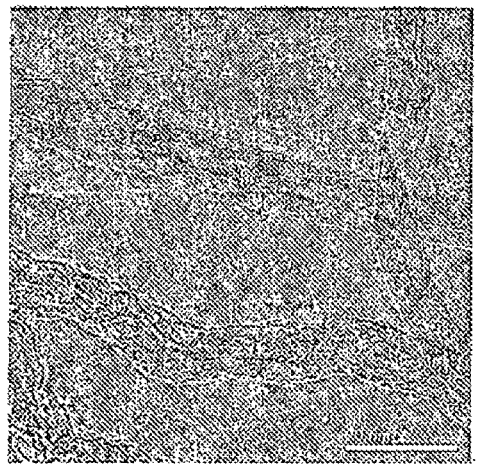
Figure 7C:
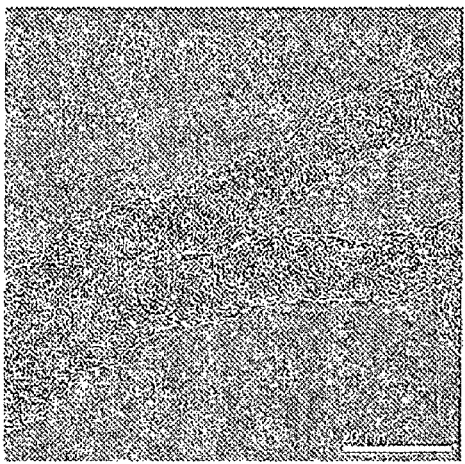
Figure 7D:
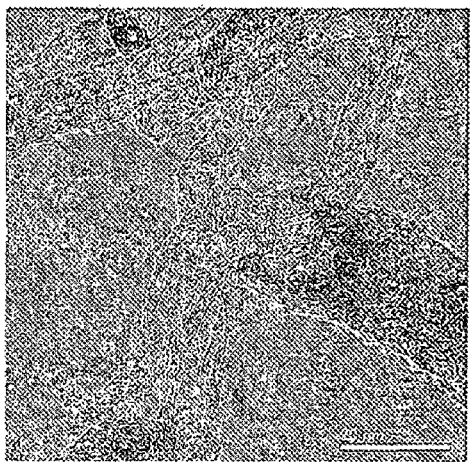

FIGS. 7A to 7D are TEM photographs showing structures of the carbon nanotubes produced using only the acetylene gas or the ethylene gas as the carbon-containing gas, FIG. 7A showing a case where only the ethylene gas is used at the wafer temperature of 425 degrees C., FIG. 7B showing a case where only the ethylene gas is used at the wafer temperature of 525 degrees C., FIG. 7C showing a case where only the acetylene gas is used at the wafer temperature of 425 degrees C., and FIG. 7D showing a case where only the acetylene gas is used at the wafer temperature of 525 degrees C.

For the wafer temperature of 425 degrees C., as shown in FIGS. 7A and 7C, it is confirmed that the formed carbon nanotubes have a solid structure having a plurality of stacked cups (a cup stack structure) for either the acetylene gas or the ethylene gas used as the carbon-containing gas.

In addition, for the wafer temperature of 525 degrees C., it is confirmed that, when the acetylene gas is used as the carbon-containing gas, some of the formed carbon nanotubes shows a hollow structure containing a hollow space along a longitudinal direction and the other thereof show a solid structure, as shown in FIG. 7D. On the other hand, it is confirmed that, when the ethylene gas is used as the carbon-containing gas, most of the formed carbon nanotubes show a hollow structure, as shown in FIG. 7B.

That is to say, it is confirmed that there is a tendency that a percentage of carbon nanotubes showing the hollow structure is higher for the ethylene gas than for the acetylene and increases with an increase in the wafer temperature for the formation of the carbon nanotubes.

In addition, as shown in these figures, it is confirmed that the carbon nanotubes are thicker for only the ethylene gas than for only the acetylene.

Here, when the carbon nanotubes show a solid structure, since it is hard for electrons to flow into the carbon nanotubes, resistance of formed wirings is not reduced as much as expected. In contrast, when the carbon nanotubes show a hollow structure, since it is easy for electrons to flow into the carbon nanotubes, the resistance of formed wirings is significantly reduced.

In addition, when the carbon nanotubes become thinner, since it is hard for electrons to flow into the carbon nanotubes, resistance of formed wirings is not reduced as much as expected. In contrast, when the carbon nanotubes become thicker, since it is easy for electrons to flow into the carbon nanotubes, the resistance of formed wirings is significantly reduced.

From the above confirmation, the present inventors have found that the resistance of wirings formed by the carbon nanotubes formed using the ethylene gas is significantly reduced, whereas the resistance of wirings formed by the carbon nanotubes formed using the acetylene gas is not reduced as much as expected, and the carbon nanotubes showing the hollow structure increase with an increase in the wafer temperature for the formation of the carbon nanotubes, which results in further reduction in the resistance of wirings formed by the carbon nanotubes.

Based on the above findings, the present inventors achieve the present disclosure to provide carbon nanotubes which are capable of realizing a low resistant depth-wise wiring.

Figure 8A:
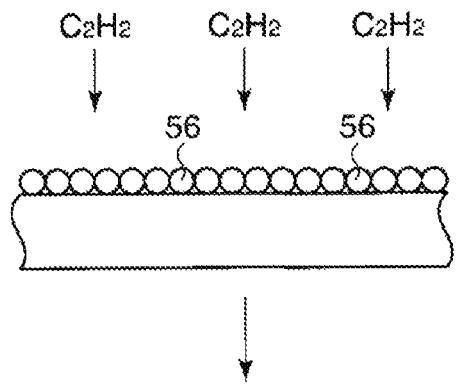
FIGS. 8A to 8C are process charts showing a carbon nanotube producing method according to one embodiment.
Figure 8B:
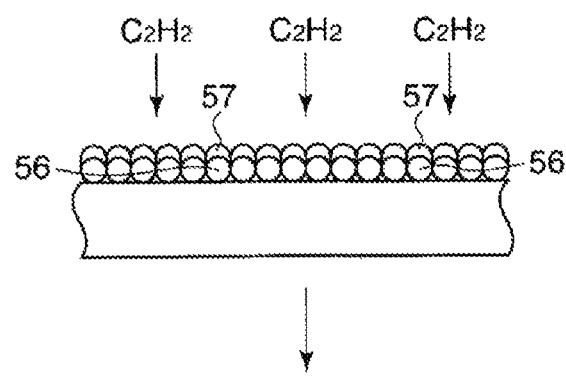
Figure 8C:
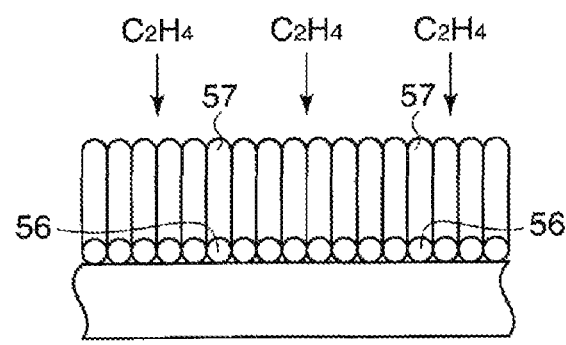

FIGS. 8A to 8C are process charts showing the carbon nanotube producing method according to this embodiment. The process shown in FIGS. 8A to 8C corresponds to Step S34 in FIG. 3. In this method, the temperature of the wafer W is set to be equal to or higher than 425 degrees C. and lower than 600 degrees C.

First, when the carbon nanotubes 57 start to be formed after the catalyst metal particles 56 are activated, only the acetylene gas as the carbon-containing gas, along with the hydrogen gas, is supplied into the processing chamber 18 via the shower plate 31, while continuing the introduction of the argon gas (FIG. 8A) (in a first carbon-containing gas supplying step).

Since the acetylene gas supplied into the processing chamber 18 has high reactivity, the acetylene gas is easily thermally decomposed into carbon atoms on the surfaces of the catalyst metal particles 56. The thermally-decomposed carbon atoms form carbon films on the surfaces of the catalyst metal particles 56 before the catalyst metal particles 56 proceed to be newly agglomerated by heating of the wafer W. Thus, the new agglomeration of the catalyst metal particles 56 is suppressed (FIG. 8A).

Subsequently, the carbon atoms obtained by thermally decomposing the acetylene gas are bonded together, with the catalyst metal particles 56 as nuclei, to thereby form carbon nanotubes 57 having a short length. At this time, since the new agglomeration of the catalyst metal particles 56 is suppressed, the catalyst metal particles 56 are not changed in size and density so that the lengths of the short carbon nanotubes 57 formed from the catalyst metal particles 56 are aligned. Further, the carbon nanotubes 57 have substantially the same diameter (FIG. 8B).

Subsequently, after a predetermined period of time, e.g., one minute, the supply of the acetylene gas is stopped and only the ethylene gas used as the carbon-containing gas is, instead of the acetylene gas, supplied into the processing chamber 18 via the shower plate 31 (in a second carbon-containing gas supplying step).

The ethylene gas supplied into the processing chamber 18 reaches the wafer W and is thermally decomposed into carbon atoms on the surfaces of the catalyst metal particles 56. The carbon atoms obtained by thermal decomposition of the ethylene gas are bonded together below the short carbon nanotubes 57 to thereby further grow the carbon nanotubes 57. However, as shown in FIG. 7B described above, when the carbon atoms obtained by thermally decomposing the ethylene gas are used, most of the formed carbon nanotubes show the hollow structure and become thick. Thus, the carbon nanotubes 57 growing at that time also have the hollow structure and become thick (FIG. 8C).

In addition, when the carbon nanotubes 57 are grown by the carbon atoms obtained by thermally decomposing the ethylene gas, since lower portions of the short carbon tubes 57 which are defined as growth start points have substantially the same diameter, the lengths of the carbon nanotubes 57 growing from the lower portions are aligned (FIG. 8C).

Thereafter, after a predetermined period of time, e.g., ten minutes, the supply of the ethylene gas is stopped, and the carbon nanotube producing method of this embodiment is terminated.

Figure 9:
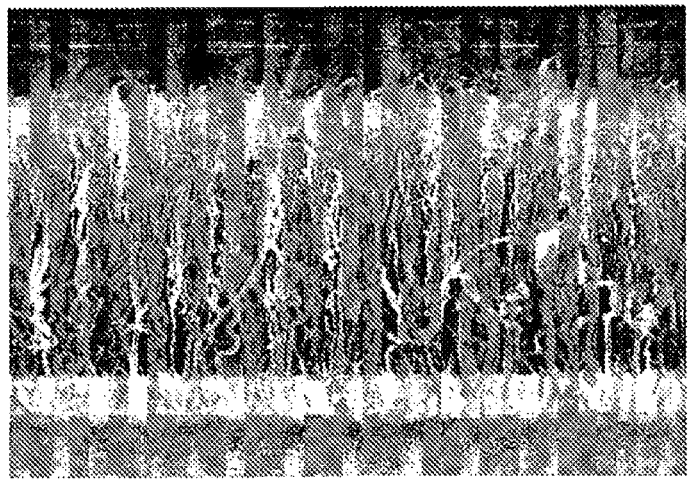
FIG. 9 is a TEM photograph showing properties of carbon nanotubes produced according to the carbon nanotube producing method shown in FIGS. 8A to 8C.

FIG. 9 is a TEM photograph showing properties of the carbon nanotubes formed by the carbon nanotube producing method shown in FIGS. 8A to 8C. The carbon nanotubes shown in FIG. 9 are formed by first supplying only the acetylene gas used as the carbon-containing gas into the processing chamber 18 for one minute and subsequently supplying only the ethylene gas used as the carbon-containing gas into the processing chamber 18 for ten minutes.

In FIG. 9, since the carbon nanotubes are grown from bottom to top, upper portions of the carbon nanotubes are formed using the acetylene gas and the middle and lower portions thereof are formed using the ethylene gas. In this case, it is confirmed that the lengths of the carbon nanotubes are aligned and, particularly, the carbon nanotubes become thick over from the middle portions to the lower portions (for example, the diameters of the carbon nanotubes are about 20 nm). Therefore, by forming wirings using these carbon nanotubes, it is possible to realize a low resistant depth-wise wiring.

Figure 10:
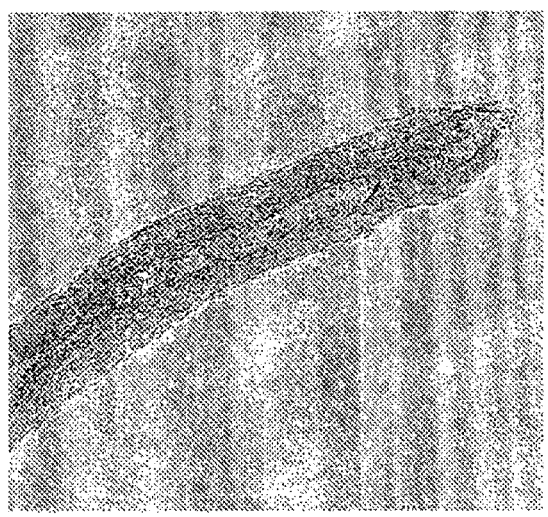
FIG. 10 is a TEM photograph showing a structure of the carbon nanotube of FIG. 9.

FIG. 10 is a TEM photograph showing a structure of the carbon nanotubes of FIG. 9. It is confirmed in FIG. 10 that the carbon nanotubes have the hollow structure.

Figure 11A:
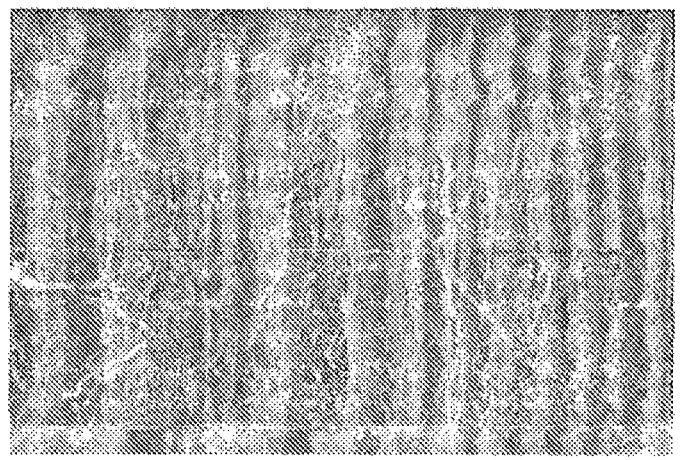
FIGS. 11A and 11B are TEM photographs showing properties of the carbon nanotubes produced by the carbon nanotube producing method shown in FIGS. 8A to 8C, FIG.
Figure 11B:
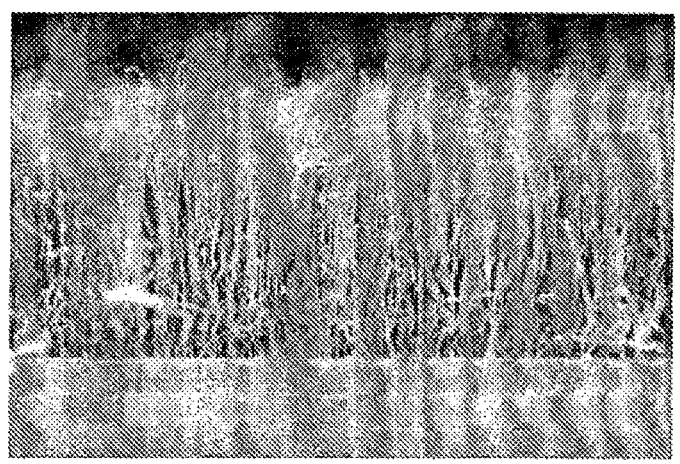

FIGS. 11A and 11B are TEM photographs showing properties of the carbon nanotubes formed by the carbon nanotube producing method shown in FIGS. 8A to 8C, FIG. 11A showing a case where the wafer temperature is 500 degrees C. and FIG. 11B showing a case where the wafer temperature is 525 degrees C. In addition, the carbon nanotubes shown in FIGS. 11A and 11B are also formed by first supplying only the acetylene gas used as the carbon-containing gas into the processing chamber 18 for one minute and subsequently supplying only the ethylene gas used as the carbon-containing gas into the processing chamber 18 for ten minutes.

Like FIG. 9, it is confirmed in either FIG. 11A or FIG. 11B that the lengths of the carbon nanotubes are aligned and, particularly, the carbon nanotubes become thick over from the middle portions to the lower portions thereof. Therefore, by forming wirings using these carbon nanotubes, it is possible to realize a low resistant depth-wise wiring.

With the carbon nanotube producing method according to this embodiment, only the acetylene gas is supplied as the carbon-containing gas when the carbon nanotubes 57 start to be formed. Since the acetylene gas has high reactivity and is decomposed to form the carbon nanotubes 57 before the catalyst metal particles 56 are agglomerated and diffused, the catalyst metal particles 56 are not changed in size and density and the lengths of the carbon nanotubes 57 affected by the size of the catalyst metal particles 56 can be aligned. In addition, thereafter, only the ethylene gas is supplied as the carbon-containing gas. The carbon nanotubes 57 formed by bonding of the carbon atoms obtained by thermal decomposition of the ethylene gas show the hollow structure and become thick. As a result, it is possible to obtain the thick carbon nanotubes 57 having the aligned lengths and showing the hollow structure, thus realizing a low resistant depth-wise wiring by bundling the carbon nanotubes 57.

In the carbon nanotube producing method according to this embodiment, when the acetylene gas or the ethylene gas is supplied as the carbon gas, since the temperature of the wafer W is set to 425 degrees C. or more, it is possible to reliably reduce the wiring resistance by increasing the percentage of low resistant carbon nanotubes 57 having the hollow structure. In addition, since the temperature of the wafer W is set to less than 600 degrees C., it is possible to prevent an insulating layer and the like in a three-dimensional packaging device from being deformed by heat. In addition, when the temperature of the wafer W is set to 525 degrees C. or more, the percentage of the low resistant carbon nanotubes 57 having the hollow structure can be increased. However, since the catalyst metal particles 56 are likely to proceed to be newly agglomerated, it is preferable that the temperature of the wafer W is set to less than 525 degrees C.

In addition, in the carbon nanotube producing method according to this embodiment, the temperature of the wafer W at the time when only the ethylene gas is supplied as the carbon-containing gas may be higher than the temperature of the wafer W at the time when only the acetylene gas is supplied. This can provide more low resistant carbon nanotubes 57 having the hollow structure.

In the carbon nanotube producing method according to this embodiment, only the acetylene gas is first supplied as the carbon-containing gas and only the ethylene gas is then supplied. In some embodiments, after only the acetylene gas is supplied, a mixture of ethylene gas and acetylene gas may be supplied. In this case, it is preferable to make the temperature of the wafer W as high as possible when the mixture of ethylene gas and acetylene gas is supplied. This can provide more carbon nanotubes having the hollow structure.

In the carbon nanotube producing method according to this embodiment, considering an increase in the number of the carbon nanotubes showing the hollow structure and an increase in the diameters of the carbon nanotubes, it is preferable that the supply time of only the acetylene gas is short. In some embodiments, in order to form carbon films on the surfaces of the catalyst metal particles 56, it is preferable to supply the acetylene gas into the processing chamber 18 for at least 30 seconds from the start of formation of the carbon nanotubes.

Next, a carbon nanotube producing method according to a second embodiment of the present disclosure will be described.

The second embodiment has basically the same configuration and operation as the first embodiment and is different from the first embodiment in that the mixture of the acetylene gas and the ethylene gas is used as the carbon-containing gas. Therefore, the explanation of the same configuration and operation is not repeated and a different configuration and operation will be described below.

Prior to the present disclosure, the present inventors have checked properties of carbon nanotubes formed using the mixture of the acetylene gas and the ethylene gas as the carbon-containing gas. At that time, a flow rate ratio of the mixture gas to the total gas including the mixture gas, the acetylene gas and the ethylene gas was set to 3.3%. Properties of carbon nanotubes formed in five Examples having different flow rate ratios of the acetylene gas and the ethylene gas to the mixture gas shown in the following table was checked.

TABLE 1

|  | Example 1 | Example 2 | Example 3 | Example 4 | Example 5 |
|---|---|---|---|---|---|
| Acetylene (%) | 100 (3.3) | 80 (2.7) | 50 (1.7) | 20 (0.7) | 0 (0) |
| Ethylene (%) | 0 (0) | 20 (0.7) | 50 (1.7) | 80 (2.7) | 100 (3.3) |

Table 1 shows flow rate ratios of gases when a flow rate ratio of the mixture gas is assumed as 100%. In this table, numerical numbers in parenthesis indicate flow rate ratios of gases when a flow rate ratio of the total gas including the mixture gas, the argon gas and the hydrogen gas is assumed as 100%.

Figure 12A:
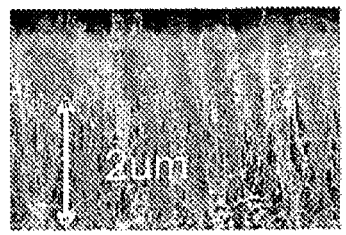
FIGS. 12A to 12H are TEM photographs showing properties of carbon nanotubes produced using a mixture of an acetylene gas and an ethylene gas as a carbon-containing gas, FIG. 12A showing Example 1, FIG. 12B showing Example 2, FIG. 12C showing Example 3, FIG. 12D showing Example 4, FIG. 12E showing Example 5, FIG. 12F being an enlarged photograph of a lower portion of each of the carbon nanotubes in Example 2, FIG. 12G being an enlarged photograph of a lower portion of each of the carbon nanotubes in Example 3, and FIG. 12H being an enlarged photograph of a lower portion of each of the carbon nanotubes in Example 4.
Figure 12B:
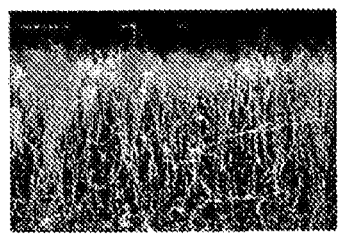
Figure 12C:
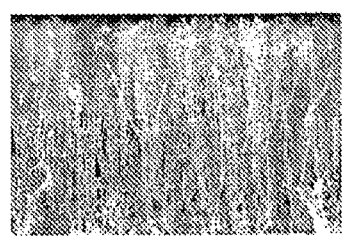
Figure 12D:
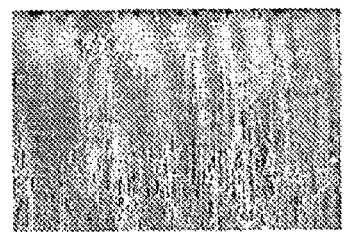
Figure 12E:
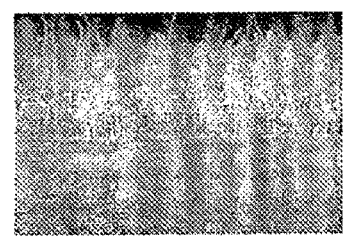
Figure 12F:
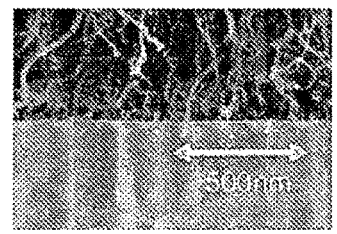
Figure 12G:
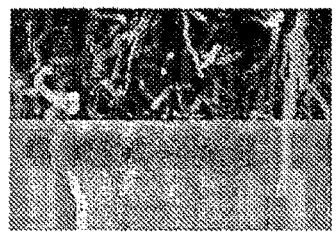
Figure 12H:
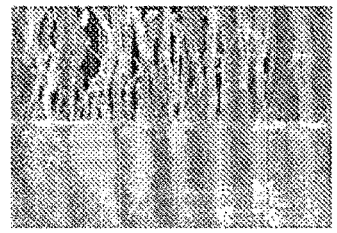

FIGS. 12A to 12H are TEM photographs showing properties of carbon nanotubes produced using the mixture of the acetylene gas and the ethylene gas as the carbon-containing gas, FIG. 12A showing Example 1, FIG. 12B showing Example 2, FIG. 12C showing Example 3, FIG. 12D showing Example 4, FIG. 12E showing Example 5, FIG. 12F being an enlarged photograph of a lower portion of each of the carbon nanotubes in Example 2, FIG. 12G being an enlarged photograph of a lower portion of each of the carbon nanotubes in Example 3, and FIG. 12H being an enlarged photograph of a lower portion of each of the carbon nanotubes in Example 4.

As shown in FIGS. 12A and 12E, it was confirmed that the lengths of the carbon nanotubes were aligned in Examples 1 to 4 except Example 5. In addition, it was confirmed that the carbon nanotubes were thick (for example, the diameters of the carbon nanotubes were about 20 nm) in Examples 3 to 5 except Examples 1 and 2.

From the above confirmation, the present inventors have found that, when the mixture of the acetylene gas and the ethylene gas is used, the lengths of the carbon nanotubes can be aligned if the acetylene gas is more or less (for example, about 20%) contained in the mixture and the carbon nanotubes can be thick if the flow rate ratio of the ethylene gas to the mixture gas is 50% or more.

Figure 13:
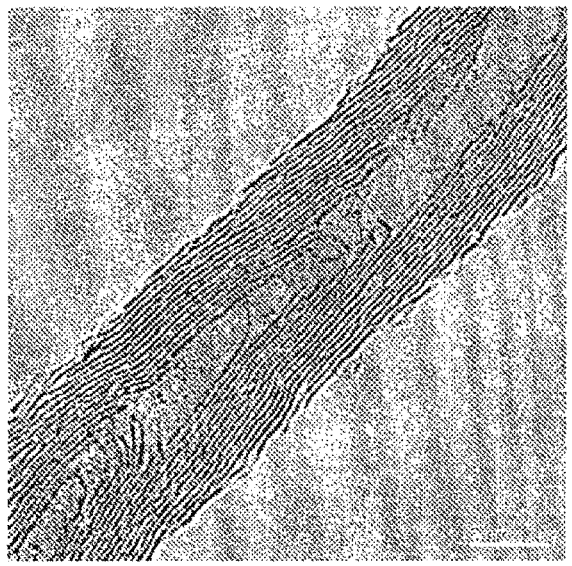
FIG. 13 is a TEM photograph showing a structure of the carbon nanotube in Example 4.

In addition, as a result of confirming structures of the carbon nanotube in Examples 1, 4 and 5 using the TEM, it was confirmed that Examples 4 and 5 show the hollow structure (for example, FIG. 13 is a TEM photograph showing a structure of the carbon nanotubes in Example 4), although Example 1 shows the solid structure. Thus, it is estimated that a higher flow rate of the ethylene gas provides lower resistance of wirings formed by the carbon nanotubes.

In addition, as shown in FIGS. 12F and 12H, it was confirmed that a degree of bending in the lower portions of the carbon nanotubes is not so high in Examples 4 and 5 but is high in Example 2. If the degree of bending of the carbon nanotubes is high (i.e., the carbon nanotubes are crimped), since electrons hardly flow into the carbon nanotubes, it is estimated that a higher flow rate of the acetylene gas provides higher resistance of wirings formed by the carbon nanotubes.

In addition, the present inventors have summarized the findings obtained from Examples 1 to 5 as shown in the following table 2.

TABLE 2

|  | Example 1 | Example 2 | Example 3 | Example 4 | Example 5 |
|---|---|---|---|---|---|
| Acetylene (%) | 100 | 80 | 50 | 20 | 0 |
| Ethylene (%) | 0 | 20 | 50 | 80 | 100 |
| Length | ◯ (Aligned) | ◯ (Aligned) | ◯ (Aligned) | ◯ (Aligned) | X (Not aligned) |
| Diameter | X (Thin) | X (Thin) | ◯ (Thick) | ◯ (Thick) | ◯ (Thick) |
| Structure | Δ (Mixed) | — (No data) | — (No data) | ◯ (Hollow) | ◯ (Hollow) |
| Bending | X (Crimped) | X (Crimped) | X (Crimped) | ◯ (Not crimped) | ◯ (Not crimped) |

In Table 2, "Length" is an index indicating whether or not the lengths of the carbon nanotubes are aligned, in which "◯" indicates that the lengths of the carbon nanotubes are aligned to such a degree that the carbon nanotubes can be used for a depth-wise wiring and "X" indicates that the lengths of the carbon nanotubes are not so aligned to be suitable for a depth-wise wiring. "Diameter" is an index indicating whether or not the carbon nanotubes are thick, in which "○" indicates that the carbon nanotubes are so thick to realize low resistance of formed wirings and "X" indicates that the carbon nanotubes are so thin not to realize low resistance of formed wirings. "Structure" is an index indicating whether the carbon nanotubes show a hollow structure or a solid structure, in which "Δ" indicates that the hollow structure and the solid structure are mixed, "○" indicates that the carbon nanotubes show the hollow structure, "X" indicates that the carbon nanotubes show the solid structure, and "-" indicates that no data are obtained. "Bending" is an index indicating whether or not the carbon nanotubes are crimped, in which "○" indicates that the carbon nanotubes are not crimped and "X" indicates that the carbon nanotubes are crimped.

Since carbon nanotubes most suitable for a depth-wise wiring require "○" for all of "Length," "Diameter," "Structure" and "Bending," Example 4 corresponds to the carbon nanotubes most suitable for a depth-wise wiring. In addition, since indexes having a high priority for wirings are "Length" and "Diameter," Example 3 is also suitable for a depth-wise wiring.

In other words, it has been found that carbon nanotubes suitable for a depth-wise wiring can be obtained if a flow rate ratio of the ethylene gas is set to 50% to 80% when a flow rate ratio of the mixture gas is assumed as 100%.

Based on the above findings, the present inventors achieve the present disclosure to provide carbon nanotubes which are capable of realizing a low resistant depth-wise wiring.

Figure 14A:
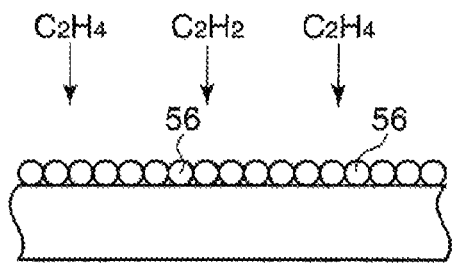
FIGS. 14A to 14C are process charts showing a carbon nanotube producing method according to a second embodiment of the present disclosure.
Figure 14B:
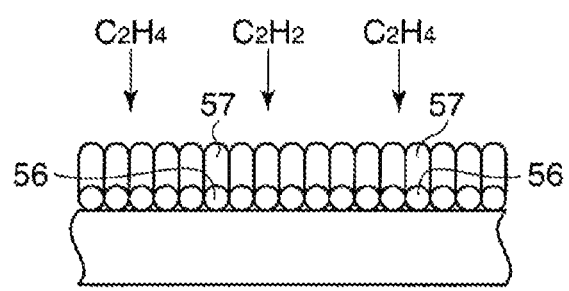
Figure 14C:
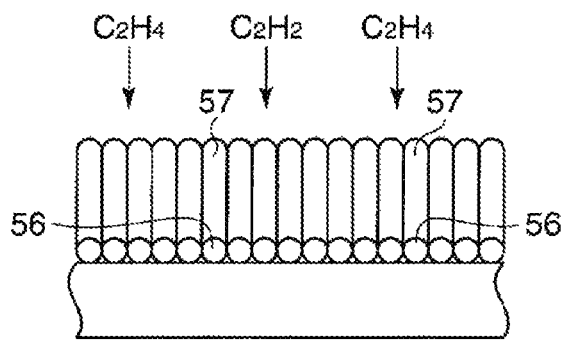

FIGS. 14A to 14C are process charts showing a carbon nanotube producing method according to this embodiment. The processes shown in FIGS. 14A to 14C correspond to Step S34 in FIG. 3. In this method, the temperature of the wafer W is set to be equal to or higher than 425 degrees C. and lower than 600 degrees C.

First, the carbon nanotubes 57 start to be formed in the thermal CVD chamber 15 after the catalyst metal particles 56 are activated in the pretreatment chamber 14. At this time, the argon gas is introduced into the processing chamber 18 and, subsequently, the mixture of the acetylene gas and the ethylene gas used as the carbon-containing gas, along with the hydrogen gas, is supplied into the processing chamber 18 (FIG. 14A). Here, a flow rate ratio of the ethylene gas is set to 50% to 80% when the flow rate ratio of the mixture gas is assumed as 100%.

Once the acetylene gas in the mixture gas reaches the wafer W, the acetylene gas is easily thermally decomposed into carbon atoms by heating of the wafer W. The thermally-decomposed carbon atoms form carbon films on the surfaces of the catalyst metal particles 56 before the catalyst metal particles 56 proceed to be newly agglomerated, thereby suppressing new agglomeration of the catalyst metal particles 56 (FIG. 14A).

In addition, the carbon atoms obtained by thermally decomposing the acetylene gas are bonded together, with the catalyst metal particles 56 as nuclei, to thereby start to form the carbon nanotubes 57. At this time, since the new agglomeration of the catalyst metal particles 56 is suppressed, the catalyst metal particles 56 have substantially the same diameter. In addition, since some of the carbon atoms are generated by decomposition of the ethylene gas in the mixture gas, the formed carbon nanotubes 57 show the hollow structure and become thick (FIG. 14B).

Thereafter, while continuing the supply of the mixture gas, the carbon atoms obtained by thermal decomposition of the mixture gas are bonded together below the carbon nanotubes 57 to thereby further grow the carbon nanotubes 57. In this case, since the lower portions of the carbon nanotubes 57 have substantially the same diameter, the lengths of the carbon nanotubes 57 growing from the tips thereof are aligned (FIG. 14C).

Thereafter, after a predetermined period of time, e.g., ten minutes, the supply of the mixture gas is stopped, and the carbon nanotube producing method according to this embodiment is terminated.

With the carbon nanotube producing method according to this embodiment, since the mixture of the acetylene gas and the ethylene gas used as the carbon-containing gas is supplied, it is possible to suppress a change in size and density of the carbon nanotubes 57, thereby aligning the lengths of the carbon nanotubes 57 and preventing the formed carbon nanotubes 57 from being thin. In addition, since the temperature of the wafer W is set to equal to or higher than 425 degrees C. and lower than 600 degrees C., it is possible to increase a percentage of low resistant carbon nanotubes 57 having the hollow structure and prevent the insulating layer and the like in the three-dimensional packaging device from being deformed by heat.

In addition, in the carbon nanotube producing method according to this embodiment, since the flow rate ratio of the ethylene gas is set to 50% to 80% when the flow rate ratio of the mixture gas is assumed as 100%, it is possible to obtain carbon nanotubes suitable for a depth-wise wiring.

While in the carbon nanotube producing method according to this embodiment, the flow rate ratio of the acetylene gas and the ethylene gas in the mixture gas has been described to be not changed, the flow rate ratio may be varied with time. As an example, the flow rate ratio of the ethylene gas in the mixture gas may be increased with time. This makes it possible to increase a percentage of carbon atoms obtained by decomposition of the ethylene gas, thereby gradually thickening the formed carbon nanotubes 57.

Next, a wiring forming method in the three-dimensional packaging device or other semiconductor devices to which the carbon nanotube producing method of the present disclosure is applied will be described.

FIGS. 15A to 15F are process charts of the wiring forming method to which the carbon nanotube producing method of the present disclosure is applied. In addition, FIGS. 15A to 15F are enlarged sectional views of portions around wirings.

First, there is prepared a wafer W which includes a lower wiring layer 59 made of metal and an insulating film 60 formed on the lower wiring layer 59. The insulating film 60 has a via 61 formed therein by a process. The via 61 is a through hole through which the lower wiring layer 59 is exposed at a bottom portion of the insulating film 60 (FIG. 15A).

Thereafter, a natural oxide film formed on a surface of the exposed lower wiring layer 59 is removed and subsequently, a catalyst metal layer 55 having a thickness of several nm is formed on the surface of the lower wiring layer 59 exposed through the via 61 from the bottom portion of insulating film 60 by a sputtering or CVD process in the catalyst metal layer forming chamber 13 (FIG. 15B). At this time, if the catalyst metal layer 55 is also formed in the side of the via 61, the carbon nanotubes 57 may be grown from the side and may interfere with the carbon nanotubes 57 grown from the lower wiring layer 59 exposed from the bottom portion of the via 61 in a thickness direction, which is likely to inhibit the growth of the carbon nanotubes 57. Therefore, in the CVD process, it is preferable that the catalyst metal layer 55 is selectively formed by an selective growth on only the surface of the lower wiring layer 59 exposed from the bottom portion of the via 61. Alternatively, it is preferable that the catalyst metal layer 55 is formed by sputtering with high anisotropy on only the surface of the lower wiring layer 59 exposed from the bottom portion of the via 61. In addition, the catalyst metal layer 55 may be formed in apparatuses other than the substrate processing system 10.

Subsequently, the pretreatment process is performed in the pretreatment chamber 14 such that the catalyst metal particles 56 are formed from the catalyst metal layer 55, and the surfaces of the catalyst metal particles 56 are activated (FIG. 15C). In addition, when the catalyst metal layer 55 is formed on the surface of the lower wiring layer 59 exposed from the bottom portion of the via 61, since the catalyst metal layer 55 is also formed on a surface of the insulating film 60 (FIG. 15B), the catalyst metal particles 56 are also formed on the surface of the insulating film 60 and the surfaces of these catalyst metal particles 56 are also activated.

Subsequently, in the thermal CVD chamber 15, the carbon nanotube producing method of the present disclosure (for example, the carbon nanotube producing method shown in FIG. 8A to 8C or 14) is performed to form the carbon nanotubes 57. At this time, as described above, since the catalyst metal particles 55 whose surfaces are activated exist on not only the bottom portion of the via 61 but also the surface of the insulating film 60, the carbon nanotubes 57 are grown from not only the bottom portion of the via 61 but also the surface of the insulating film 60 (FIG. 15D).

Subsequently, the wafer W is unloaded from the substrate processing system 10, and the carbon nanotubes 57 on the surface of the insulting film 60 and the carbon nanotubes 57 projecting from the via 61 are removed by a CMP (Chemical Mechanical Polishing) apparatus or the like (FIG. 15E).

Subsequently, a wiring 62 made of graphene or the like is formed to cover the insulating film 60 and the carbon nanotubes 57 in a transverse direction in the figure (FIG. 15F). Thus, the wiring forming method is terminated. At this time, the lower wiring layer 59 is coupled to the wiring 62 through the carbon nanotubes 57 formed inside the via 61.

FIGS. 16A to 16E are process charts of another wiring forming method to which the carbon nanotube producing method of the present disclosure is applied. In addition, FIGS. 16A to 16E are enlarged sectional views of portions around wirings.

First, there is prepared a wafer W which includes a lower wiring layer 59 made of metal and an insulating film 60 formed on the lower wiring layer 59. The insulating film 60 has a via 61 formed therein by a process. The via 61 is a through hole through which the lower wiring layer 59 is exposed at a bottom portion of the insulating film 60. The exposed lower wiring layer 59 is covered by the catalyst metal layer 55 used as a metal cap layer in advance (FIG. 16A).

Subsequently, the pretreatment process is performed in the pretreatment chamber 14 such that the catalyst metal particles 56 are formed from the catalyst metal layer 55, and the surfaces of the catalyst metal particles 56 are activated (FIG. 16B).

Subsequently, in the thermal CVD chamber 15, the carbon nanotube producing method of the present disclosure (for example, the carbon nanotube producing method shown in FIG. 8A to 8C or 14) is performed to form the carbon nanotubes 57. In this wiring forming method, since the catalyst metal particles 55 whose surfaces are activated exist on only the bottom portion of the via 61, the carbon nanotubes 57 are grown from only the bottom portion of the via 61 (FIG. 16C).

Thereafter, the wafer W is unloaded from the substrate processing system 10, and the carbon nanotubes 57 projecting from the via 61 are removed by a CMP apparatus or the like (FIG. 16D).

Subsequently, a wiring 62 made of graphene or the like is formed to cover the insulating film 60 and the carbon nanotubes 57 in a transverse direction in the figure (FIG. 16E). Thus, the wiring forming method of this embodiment is terminated. At this time, the lower wiring layer 59 is coupled to the wiring 62 through the carbon nanotubes 57 form inside the via 61.

Although the present disclosure has been described by way of the above embodiments, the present disclosure is not limited to the above embodiments.

As an example, while in the above embodiments, the temperature of the wafer W has been described to be not changed when the carbon nanotubes 57 are formed, the temperature of the wafer W may be varied with time. As an example, the temperature of the wafer W may be increased with time. This makes it possible to increase a percentage of carbon nanotubes showing the hollow structure.

According to the present disclosure, since the acetylene gas having high reactivity is supplied at an initial stage of carbon nanotube production, agglomeration and diffusion of catalyst metal particles are prevented. Thus, the catalyst metal particles are not changed in size and lengths of carbon nanotubes affected by the size of the catalyst metal particles can be aligned. Further, in a termination stage of carbon nanotube production, since the ethylene gas is supplied, it is possible to prevent the produced carbon nanotubes from being thinned. As a result, it is possible to realize a low resistant depth-wise wiring by bundling the carbon nanotubes.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of producing a carbon nanotube by supplying a carbon-containing gas onto a substrate, comprising:
    supplying a first carbon-containing gas at an initial stage of carbon nanotube production for a predetermined period of time;
    after the lapse of the predetermined period of time, terminating the supply of the first carbon-containing gas; and
    immediately after the termination of the supply of the first carbon-containing gas, subsequently supplying a second carbon-containing gas at a termination stage of carbon nanotube production,
    wherein in the initial stage of carbon nanotube production, the first carbon-containing gas supplied onto the substrate contains only an acetylene gas,
    wherein in the termination stage of carbon nanotube production, the second carbon-containing gas supplied onto the substrate contains only an ethylene gas, and wherein a temperature of the substrate is set to be equal to or higher than 425 degrees C. and lower than 525 degrees C.

2. The method of claim 1, wherein the temperature of the substrate in the termination stage of carbon nanotube production is set to be higher than the temperature of the substrate in the initial stage of carbon nanotube production.

3. A method of forming a depth-wise wiring in a three-dimensional packaging device formed on a substrate, comprising:
supplying a first carbon-containing gas and a second carbon-containing gas onto the substrate,
wherein the act of supplying the first carbon-containing gas and the second carbon-containing gas includes:
supplying the first carbon-containing gas at an initial stage of carbon nanotube production for a predetermined period of time;
after the lapse of the predetermined period of time, terminating the supply of the first carbon-containing gas; and
immediately after the termination of the supply of the first carbon-containing gas, subsequently supplying the second carbon-containing gas at a termination stage of carbon nanotube production, and
wherein in the initial stage of carbon nanotube production, the first carbon-containing gas supplied onto the substrate contains only an acetylene gas,
wherein in the termination stage of carbon nanotube production, the second carbon-containing gas supplied onto the substrate contains only an ethylene gas, and
wherein a temperature of the substrate is set to be equal to or higher than 425 degrees C. and lower than 525 degrees C.

4. A wiring forming method, comprising:
a catalyst metal forming step in which a catalyst metal layer is formed in a bottom portion of a recess of an insulating film formed on a substrate;
a pretreatment step in which catalyst metal particles are formed from the catalyst metal layer and the formed catalyst metal particles are activated; and
a carbon nanotube producing step in which carbon nanotubes are grown in the recess according to the carbon nanotube producing method of claim 1.

5. A wiring forming method, comprising:
a pretreatment step in which a surface of a catalyst metal layer previously formed in a bottom portion of a recess of an insulating film formed on a substrate is activated; and
a carbon nanotube producing step in which carbon nanotubes are grown in the recess according to the carbon nanotube producing method of claim 1.

6. The method of claim 1, further comprising supplying a reducing gas onto the substrate along with the first carbon-containing gas and the second carbon-containing gas, the reducing gas including an $H_2$ gas or an $NH_3$ gas.

7. The method of claim 1, wherein the acetylene gas is supplied as the first carbon-containing gas for at least 30 seconds at the initial stage of carbon nanotube production.

8. The method of claim 7, wherein an internal pressure of a processing chamber including the substrate is 66.7 Pa to 667 Pa at the initial stage of carbon nanotube production.

9. The method of claim 7, wherein an internal pressure of a processing chamber including the substrate is 400 Pa to 667 Pa at the initial stage of carbon nanotube production.

10. The method of claim 7, wherein a flow rate of each of the first carbon-containing gas and the second carbon-containing gas is 5 sccm to 200 sccm.

11. The method of claim 7, wherein a flow rate of each of the first carbon-containing gas and the second carbon-containing gas is 6 sccm to 30 sccm.

12. The method of claim 7, further comprising supplying a mixture of an $H_2$ gas and an Ar gas along with the first carbon-containing gas and the second carbon-containing gas.

13. The method of claim 12, wherein a flow rate of the Ar gas is 100 sccm to 2000 sccm.

* * * * *